US009398393B2

(12) United States Patent
Antani et al.

(10) Patent No.: US 9,398,393 B2
(45) Date of Patent: Jul. 19, 2016

(54) AURAL PROXIES AND DIRECTIONALLY-VARYING REVERBERATION FOR INTERACTIVE SOUND PROPAGATION IN VIRTUAL ENVIRONMENTS

(71) Applicant: The University of North Carolina at Chapel Hill, Chapel Hill, NC (US)

(72) Inventors: Lakulish Shailesh Antani, Chapel Hill, NC (US); Dinesh Manocha, Chapel Hill, NC (US)

(73) Assignee: The University of North Carolina at Chapel Hill, Chapel Hill, NC (US)

( * ) Notice: Subject to any disclaimer, the term of this patent is extended or adjusted under 35 U.S.C. 154(b) by 214 days.

(21) Appl. No.: 14/081,803

(22) Filed: Nov. 15, 2013

(65) Prior Publication Data

US 2014/0161268 A1 Jun. 12, 2014

Related U.S. Application Data

(60) Provisional application No. 61/735,989, filed on Dec. 11, 2012.

(51) Int. Cl.
*H03G 3/00* (2006.01)
*H04S 7/00* (2006.01)

(52) U.S. Cl.
CPC ............. *H04S 7/305* (2013.01); *H04S 2420/11* (2013.01)

(58) Field of Classification Search
CPC ............................. G10K 15/12; G10H 1/0091
USPC ................................ 381/61, 63, 310; 463/35
See application file for complete search history.

(56) References Cited

U.S. PATENT DOCUMENTS

| | | | | |
|---|---|---|---|---|
| 7,606,375 | B2 * | 10/2009 | Bailey | H04S 3/00 345/418 |
| 2008/0137875 | A1 * | 6/2008 | Zong | G10K 15/12 381/63 |
| 2010/0008513 | A1 | 1/2010 | Bailey et al. | |

OTHER PUBLICATIONS

Aliaga et al., "MMR: An Interactive Massive Model Rendering System Using Geometric and Image-Based Acceleration," Proc. Symposium on Interactive 3D Graphics, pp. 199-206 (1999).
Allen et al., "Image method for efficiently simulating small-room acoustics," J. Acoustical Society of America, vol. 65, No. 4, pp. 943-950 (Apr. 1979).
Antani et al., "Interactive Sound Propagation using Compact Acoustic Transfer Operators," ACM Transactions on Graphics, pp. 1-12 (2012).
Decoret et al., "Billboard Clouds for Extreme Model Simplification," ACM Trans. Graphics, vol. 22, No. 3, pp. 689-696 (Mar. 2003).

(Continued)

*Primary Examiner* — Disler Paul
(74) *Attorney, Agent, or Firm* — Jenkins, Wilson, Taylor & Hunt, P.A.

(57) ABSTRACT

The subject matter described herein includes a method for simulating directional sound reverberation. The method includes performing ray tracing from a listener position in a scene to surface as visible from a listener position. The method further includes determining a directional local visibility representing a distance from a listener position to nearer surface in the scene alone each ray. The method further includes determining directional reverberation at the listener position based on the directional local visibility. The method further includes rendering a simulated sound indicative of the directional reverberation at the listener position.

20 Claims, 11 Drawing Sheets

(56) References Cited

OTHER PUBLICATIONS

Eyring, "Reverberation Time in "Dead" Rooms," J. Acoustical Society of America, vol. 1, pp. 217-241 (1930).
Funkhouser et al., "A Beam Tracing Approach to Acoustic Modeling for Interactive Virtual Environments," Proc. SIGGRAPH 1998, pp. 21-32 (1998).
Gumerov et al., "A broadband fast multipole accelerated boundary element method for the three dimensional Helmholtz equation," J. Acoustical Society of America, vol. 125, No. 1, pp. 191-205 (Jan. 2009).
"Interactive 3D Audio Rendering Guidelines—Level 2.0," Revision 1.0a, http://www.iasig.org/pubs/3d12vla.pdf, pp. 1-29 (Sep. 20, 1999).
Landis, "Production-ready global illumination," SIGGRAPH Course Notes, pp. 1-18 (2002).
Kuttruff, "Room Acoustics," Spon Press, 389 pgs. (2000).
Larsson et al., "Better Presence and Performance in Virtual Environments by Improved Binaural Sound Rendering," AES 22nd International Conference on Virtual, Synthetic and Entertainment Audio, pp. 1-8 (2002).
Larsson et al., "On the quality of experience: a multi-modal approach to perceptual ego-motion and sensed presence in virtual environments," ISCA ITRW on Auditory Quality of Systems, pp. 97-100 (2003).
Loos et al., "Modular Radiance Transfer," ACM Transactions on Graphics, ACM Siggraph, vol. 30, No. 6, pp. 1-10 (Dec. 2011).
Maciel et al., "Visual Navigation of Large Environments Using Textured Clusters," Proc. Symp. on Interactive 3D Graphics, pp. 1-8 (1995).
Pulkki, "Spatial Sound Generation and Perception by Amplitude Panning Techniques," Helsinki University of Technology, 59 pgs. (2001).
Raghuvanshi et al., "Efficient and Accurate Sound Propagation Using Adaptive Rectangular Decomposition," IEEE Transaction on Visualization and Computer Graphics, vol. 15, No. 5, pp. 1-10 (2009).
Raghuvanshi et al., "Precomputed Wave Simulation for Real-Time Sound Propagation of Dynamic Sources in Complex Scenes," ACM Trans. Graphics, vol. 29, No. 4, pp. 1-11 (2010)
Shanmugam et al., "Hardware Accerated Ambient Occlusion Techniques on GPUs," Proc. Symposium on Interactive 3D Graphics, pp. 73-80 (2007).
Siltanen et al., "The room acoustic rendering equation," J. Acoustical Society of America, vol. 122, No. 3, pp. 1624-1635 (Sep. 2007).
Sloan, "Stupid Spherical Harmonics (SH) Tricks," Game Developers Conference, pp. 1-42 (2008).
Sloan et al., "Precomputed Radiance Transfer for Real-Time Rendering in Dynamic, Low-Frequency Lighting Enviroments," SIGGRAPH, pp. 527-536 (2002).
Storms, "Auditory-Visual Cross-Modal Perception Phenomena," Naval Postgraduate School, pp. 1-275 (Sep. 1998).
Svensson et al., "An analytic secondary source model of edge diffraction impulse responses," J. Acoustical Society of America, vol. 106, No. 5, pp. 2331-2344 (Nov. 1999).
Taylor et al. "Guided Mulitview Ray Tracing for Fast Auralization," IEEE Trans. Visualization and Computer Graphics, pp. 1-14 (Nov. 2012).
Thompson, "A review of finite element methods for time-harmonic acoustics," J. Acoustical Society of America, vol. 199, No. 3, pp. 1-42 (2006).
Tisngos, "Pre-computing geometry-based reverberation effects for games," AES Conference on Audio for Games, pp. 1-10 (Feb. 2009).
Tsingos et al., "Modeling Acoustics in Virtual Environments Using the Uniform Theory of Diffraction," Proc. SIGGRAPH 2001, pp. 1-9 (2001).
Vorlander, "Simulation of the transient and steady-state sound propagation in rooms using a new combined ray-tracing/image-source algorithm," J. Acoustical Society of America, vol. 86, No. 1, pp. 172-178 (Jul. 1989).
Vorlander et al., "Definition and measurement of random-incidence scattering coefficients," Applied Acousitcs, vol. 60, No. 2, pp. 187-199 (2000).
Zhukov et al., "An ambient light illumination model," Rendering Techniques, pp. 45-55 (1998).

* cited by examiner (A) TRAIN STATION (9k POLYGONS)

(B) CITADEL (23k POLYGONS)

(C) RESERVOIR (32k POLYGONS)

(D) OUTLANDS (56k POLYGONS)

AURAL PROXIES AND DIRECTIONALLY-VARYING REVERBERATION FOR INTERACTIVE SOUND PROPAGATION IN VIRTUAL ENVIRONMENTS

PRIORITY CLAIM

This application claims the benefit of U.S. Provisional Patent Application Ser. No. 61/735,989, filed Dec. 11, 2012; the disclosure of which is incorporated herein by reference in its entirety.

GOVERNMENT INTEREST

This invention was made with government support under Grant No. W911NF-10-1-0506 awarded by the Army Research Office and Grant Nos. CMMI-1000579, IIS-0917040, and 0904990 awarded by the National Science Foundation. The government has certain rights in the invention.

TECHNICAL FIELD

The subject matter described herein relates to estimating sound reverberation. More particularly, the subject matter described herein relates to aural proxies and directionally-varying reverberation for interactive sound propagation in virtual environments.

BACKGROUND

Video games, virtual reality, augmented reality, and other environments simulate sound reverberations to make the environments more realistic. To make the simulated sound reverberation more realistic, it is desirable to simulate directionally varying reverberations and early reflections so that the sound experienced by a listener will vary based on the listener position and orientation with respect to the sound source. Accordingly, there exists a need for methods, systems, and computer readable media for providing aural proxies and simulating directionally varying reverberation and early reflections for interactive sound propagation in virtual environments.

SUMMARY

The subject matter described herein includes an efficient algorithm to compute spatially-varying, direction-dependent artificial reverberation and reflection filters in large dynamic scenes for interactive sound propagation in virtual environments and video games. The present approach performs Monte Carlo integration of local visibility and depth functions to compute directionally-varying reverberation effects. The algorithm also uses a dynamically-generated rectangular aural proxy to efficiently model 2-4 orders of early reflections. These two techniques are combined to generate reflection and reverberation filters which vary with the direction of incidence at the listener. This combination leads to better sound source localization and immersion. The overall algorithm is efficient, easy to implement, and can handle moving sound sources, listeners, and dynamic scenes, with minimal storage overhead. We have integrated our approach with the audio rendering pipeline in Valve's Source game engine, and use it to generate realistic directional sound propagation effects in indoor and outdoor scenes in real-time. We demonstrate, through quantitative comparisons as well as evaluations, that the present approach leads to enhanced, immersive multi-modal interaction.

According to one aspect, the subject matter described herein includes a method for simulating directional sound reverberation. The method includes performing ray tracing from a listener position in a scene to surface as visible from a listener position. The method further includes determining a directional local visibility representing a distance from a listener position to nearer surface in the scene alone each ray. The method further includes determining directional reverberation at the listener position based on the directional local visibility. The method further includes rendering a simulated sound indicative of the directional reverberation at the listener position.

The subject matter described herein may be implemented in hardware, software, firmware, or any combination thereof. As such, the terms "function" "node" or "module" as used herein refer to hardware, which may also include software and/or firmware components, for implementing the feature being described. In one exemplary implementation, the subject matter described herein may be implemented using a computer readable medium having stored thereon computer executable instructions that when executed by the processor of a computer control the computer to perform steps. Exemplary computer readable media suitable for implementing the subject matter described herein include non-transitory computer-readable media, such as disk memory devices, chip memory devices, programmable logic devices, and application specific integrated circuits. In addition, a computer readable medium that implements the subject matter described herein may be located on a single device or computing platform or may be distributed across multiple devices or computing platforms.

BRIEF DESCRIPTION OF THE DRAWINGS

The subject matter described herein will now be explained with reference to the accompanying drawings of which.

DETAILED DESCRIPTION

Figure 1:
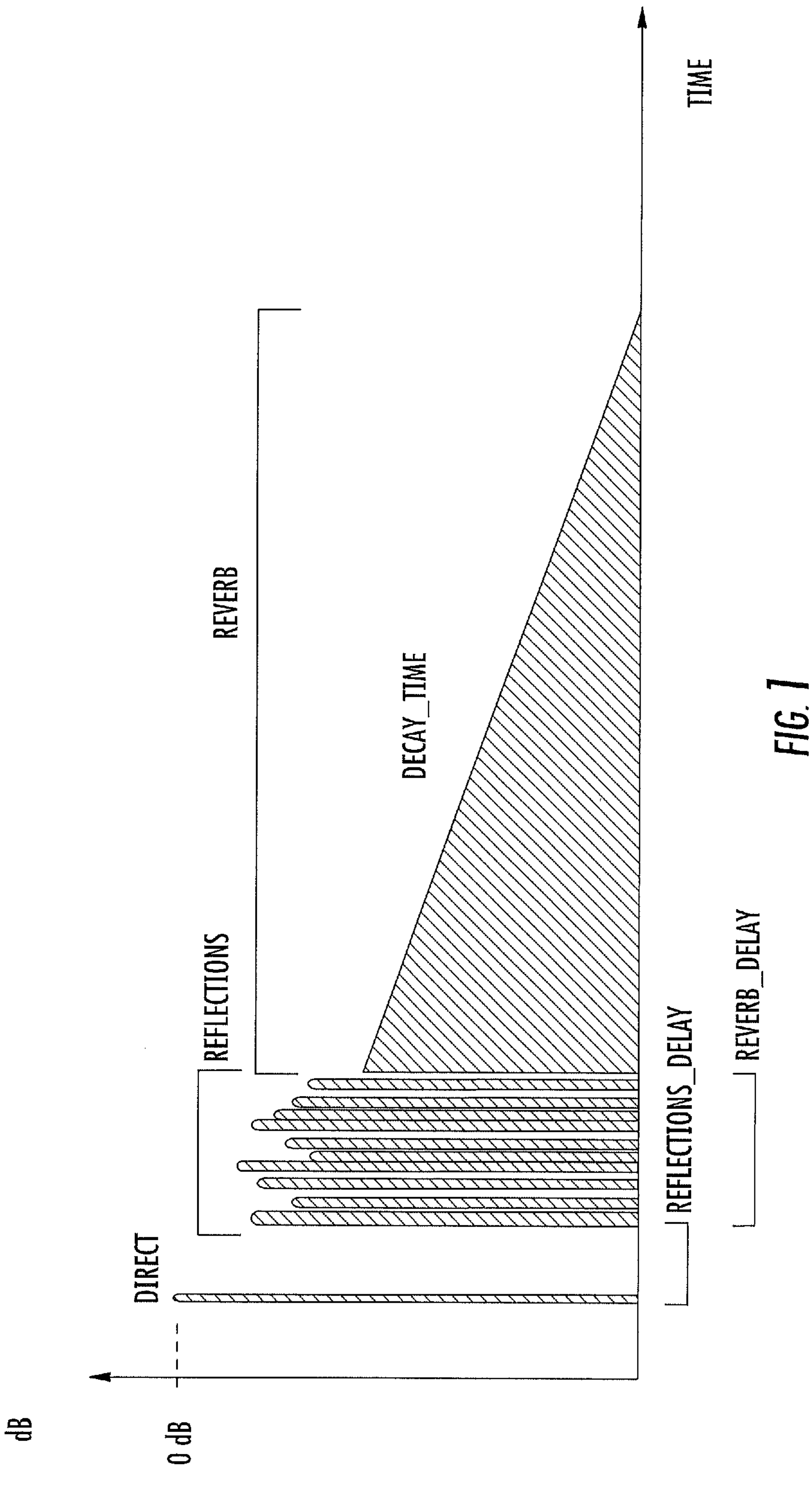
FIG. 1 is a graph illustrating major components of propagated sound.

As the visual quality of video games and virtual reality systems continuously improves, there is increased emphasis on other modalities such as sound rendering to improve the realism of virtual environments. Several experiments and user studies [5, 26, 14, 15] have shown that improved sound rendering leads to an increased sense of presence in virtual environments. In addition, investigation of audio-visual cross-modal effects has shown that a greater correlation between audio and visual rendering leads to an improved sense of spaciousness of the environment, and an improved ability to locate sound sources [14, 15]. As a result, there has been significant research on sound propagation [28, 19, 32, 23], i.e., computing the manner in which sound waves reflect and diffract about obstacles as they travel through an environment. In particular, reverberation, i.e., sound reaching the listener after a large number of successive temporally dense reflections with decaying amplitude, lends large spaces a characteristic impression of spaciousness. It is the primary phenomenon used by game designers and VR systems to create immersive acoustic spaces. In addition, early reflections, i.e., sound reaching the listener after a small number of reflections, play an important role in helping the user pinpoint the sound source position. In this disclosure, we address the problem of interactively computing reflection and reverberation effects which plausibly vary with the position and orientation of the listener.

Modeling sound propagation at interactive rates—which, in this context, refers to updating sound propagation effects at 15-20 Hz or more [10]—is a computationally challenging problem. Numerical methods for solving the acoustic wave equation cannot model large scenes or high frequencies efficiently. Methods based on ray tracing cannot interactively model the very high orders of reflection needed to model reverberation. Moreover, ray tracing methods require significant computational resources even for modeling early reflections, which makes them impractical for use in a game engine. Precomputation-based techniques offer a promising solution; however, the storage costs for these techniques are still impractical for large scenes on commodity hardware.

Given the high computational complexity of sound propagation, current video games still use techniques outlined over a decade ago in the Interactive 3D Audio Level 2 specification [10]. Since VR training systems are increasingly based on game engines, the limitations of this model apply to these systems as well. These techniques model reverberation using simple artificial reverberation filters [11], which capture the statistics of reverberant decay using a small set of parameters. The designer manually specifies multiple reverberation filters for different regions of the scene; these filters are interpolated at runtime to provide smooth audio transitions. This approach has two major limitations. Firstly, the amount of spatial detail in the sound field directly depends on the designer's effort, since more reverberation regions must be specified for higher spatial detail. Secondly, the modeled reverberation is not direction-dependent, which leads to reduced immersion. Direction-dependent reverberation provides audio cues for the physical layout of an environment relative to a listeners position and orientation. For example, in a small room with a door opening into a large hangar, one would expect reverberation to be heard in the small room through the open door. This effect cannot be captured without direction-dependent reverberation.

These simple reverberation models cannot handle outdoor scenes, where echoes, not reverberation, are the dominant acoustic effect. In such cases, designers rely on their judgment to specify static filters for modeling outdoor scenes. This results in a static sound field which does not vary as the listener moves around, and is limited to directionally-invariant effects.

Main Results.

We present a simple and efficient sound propagation algorithm inspired by work on local illumination models (such as ambient occlusion) and the use of proxy geometry in visual rendering. Our approach generates spatially-varying, direction-dependent reflections and reverberation in large scenes at interactive rates. We perform Monte Carlo integration of local visibility and depth functions for a listener, weighted by spherical harmonics basis functions. Our approach also computes a local geometry proxy which is used to compute 2-4 orders of directionally-dependent early reflections, allowing our technique to plausibly model outdoor scenes as well as indoor scenes. Our approach reduces manual effort, since it automatically generates spatially-varying reverberation based on the scene geometry. Our approach also enables immersive, direction-dependent reverberation due to the use of spherical harmonics to compactly represent directionally-varying depth functions. It is highly efficient, requiring only 5-10 ms to update the reflection and reverberation filters for scenes with tens of thousands of polygons on a single CPU core, and is easy to implement and integrate into an existing game, as shown by our integration with Valve's Source engine. We also evaluate our results by comparison against a reference image source method, and through a preliminary user study.

The description herein is organized as follows. Section 2 presents an overview of related work. Sections 3 and 4 present our algorithm, and Section 5 presents results and analysis based on our implementation. Finally, Section 6 concludes with a discussion of limitations and potential avenues for future work.

2 Related Work

In this section, we present a brief overview of prior work on sound propagation and reverberation, 2.1 Sound Propagation and Impulse Responses Sound received at a listener after propagation through the environment is typically divided into three components [12]: (a) direct sound, i.e., sound reaching the listener directly from a source visible to the listener; (b) early reflections, consisting of sound that has undergone a small number (typically 1-4) of reflections and/or diffractions before reaching the listener;

and (c) reverberation, consisting of a large number of successive temporally dense reflections with decaying amplitude (see FIG. 1). Direct sound and early reflections aid in localizing the sound source, while reverberation gives a sense of the size of the environment, and improves the sense of immersion.

The output of a sound propagation algorithm is a quantity called the impulse response between the source and the listener. The impulse response is the signal received at the listener when the source emits a unit impulse signal. Acoustics in a stationary, homogeneous medium can be viewed as a linear time-invariant system [12], and hence the signal received at the listener in response to an arbitrary signal emitted by the source can be obtained by convolving the source signal with the impulse response. In our work, we use impulse responses to represent early reflections.

2.2 Wave Simulation

Accurate, physically-based sound propagation can be modeled by numerically solving the acoustic wave equation, using techniques such as finite differences [28], finite elements [30], or boundary elements [9]. However, these techniques require the interior or boundary of the scene to be discretized at the Nyquist rate for the maximum frequency simulated. Hence, these techniques often require hours of simulation time and gigabytes of storage to model low frequencies in large scenes, and scale as the third or fourth power of frequency. Despite recent advances [19], they remain impractical for real-time simulation.

2.3 Geometric Acoustics

Most high-performance acoustics simulation systems are based on geometric techniques [33, 8], which make the assumption that sound travels along linear rays. These methods exploit modem high-performance ray tracing techniques [29] to efficiently model sound propagation in complex, dynamic scenes. The geometric assumption limits these methods to accurate simulation of specular and diffuse reflections at high frequencies only; diffraction is typically modeled separately [27,32] by identifying individual diffracting edges. While geometric techniques can interactively model early reflections and diffraction, they cannot interactively model reverberation, since they would require very high orders (50-100) of reflection.

2.4 Precomputed Sound Propagation

Over the last decade, there has been much research on precomputation-based techniques for real-time sound propagation. Guided by the observation that large portions of typical game scenes are static, these techniques precompute sound propagation between static portions of the scene, and use this precomputed data at run-time to update the response from moving sources to a moving listener. Precomputation techniques have been developed based on wave solvers [20] as well as geometric methods [23, 31, 3]. However, these methods cannot practically handle large scenes with long reverberation tails (3-8 seconds), since the size of the precomputed data set scales quadratically with scene size (volume or surface area) and linearly with reverberation length. Developing compressed representations of precomputed sound propagation data is an active area of research. Methods such as beam tracing [8] generate compact data sets, but are limited to static sources.

2.5 Artificial Reverberation

Current games and VR systems model reverberation effects using techniques such as feedback delay networks [11], which encode the parameters of a statistical model describing reverberant sound. The scene must be manually divided into zones, and reverberation parameters must be manually specified for each zone. Parameters are interpolated between zones to create smooth audio transitions [10]. Recently, Bailey and Brumitt presented a technique [4] based on cube map rasterization to automatically determine reverberation parameters. Our approach is similar in spirit, but uses local visibility and depth information to adjust these reverberation parameters. This allows for a greater degree of designer control and enables immersive directional reverberation effects.

2.6 Local Approximations in Visual Rendering

Ambient occlusion [13] is a popular technique used in movies and video games to model shadows cast by ambient light. The intensity of light at a given surface point is evaluated by integrating a local visibility function, with cosine weights, over the outward-facing hemisphere at the surface point. The integral is evaluated by Monte Carlo sampling of the local visibility function. This method can be generalized to obscurance, where the visibility function is replaced by a distance attenuation function [35]. In recent years, screen-space techniques have been developed [22] to efficiently compute approximate ambient occlusion in real-time on modem graphics hardware. Our approach is related to these methods in that we integrate a local depth function to estimate the reverberation properties at a given listener position. Our approach differs from ambient occlusion methods in that we integrate over a sphere centered at the listener position, instead of a hemisphere centered at a surface point.

Many techniques have been developed to accelerate the rendering of large, complex scenes using proxy geometry or impostors. These techniques replace complex geometry with simple proxies such as planar quadrilaterals [17] which may be dynamically generated [21]. Proxy methods have also been used to render distant objects such as clouds [6]. Textured box culling [1] is a method for representing far field geometry by a 6-sided textured cube. In addition to accelerating the rendering of large, complex scenes, simplified proxies can also be used to significantly accelerate the computation of complex, computationally-intensive phenomena such as global illumination. Modular radiance transfer [16] describes a method for replacing complex geometry with cubical proxies, which are then used to compute indirect illumination in response to direct illumination computed for the original, complex geometry. Our method shares some similarities with these previous methods, in that it fits a 6-sided cubical proxy to the local geometry around the listener, and uses this proxy to compute higher-reflections in response to first-order reflections computed using the original geometry.

3 Directionally-Varying Reverberation

In this section, we describe our algorithm for computing dynamic spatially-varying directional reverberation. We begin by describing the statistical model we use to relate the parameters of an artificial reverberation filter to the geometry of a scene.

3.1 Artificial Reverberation and Reverberation Time

Artificial reverberation aims to model the statistics of how sound energy decays in a space over time. For example, an often-used statistical model for reverberation in a single rectangular room is the Eyring model [7]:

$$E(t) = E_0 e^{\frac{cS}{4V} t \log(1-\alpha)}, \tag{1}$$

where $E_0$ is a constant, c is the speed of sound in air, S is the total surface area of the room, V is the volume of the room, and $\alpha$ is the average absorption coefficient of the surfaces in the room. An artificial reverberator implements such a statistical model using techniques such as feedback delay networks [11]. These techniques model a digital filter using an infinite impulse response, i.e., using a recursive expression such as [11];

$$y(t)=\Sigma_{i=1}^{N} c_i s_i(t)+dx(t) \quad (2)$$

$$s_i(t+\Delta t_i)=\Sigma_{j=1}^{N} a_{i,j} s_j(t)+b_i x(t) \quad (3)$$

The various constants in these models are specified in terms of several parameters, such as reverberation time, modal density, and low-pass filtering; the I3DL2 specification contains representative examples [10]. The most important of these parameters is reverberation time $RT_{60}$, which is defined as the time required for sound energy to decay by 60 dB, i.e., to one millionth of its original strength, at which point it is considered to be inaudible [7].

3.2 Reverberation and Mean Free Path

Intuitively, the reverberation time is related to the manner in which sound undergoes repeated reflections off of the surfaces in the scene. This in turn is quantified using the mean free path t, which is the average distance that a sound ray travels between successive reflections. Mathematically, these two quantities are related as follows [12]:

$$T = k\frac{\mu}{\log(1-\alpha)}, \quad (4)$$

where T is the reverberation time, μ is the mean free path, α is the average surface absorption coefficient, and k is a constant of proportionality. Note that for a single rectangular room, $$\mu = \frac{cS}{4V}$$

and it can be shown that Equation 4 can be reduced to the Eyring model. Next, we describe an approach for adjusting a user-controlled mean free path based on local geometry information.

3.3 Spatially-Varying Reverberation

Figure 2:
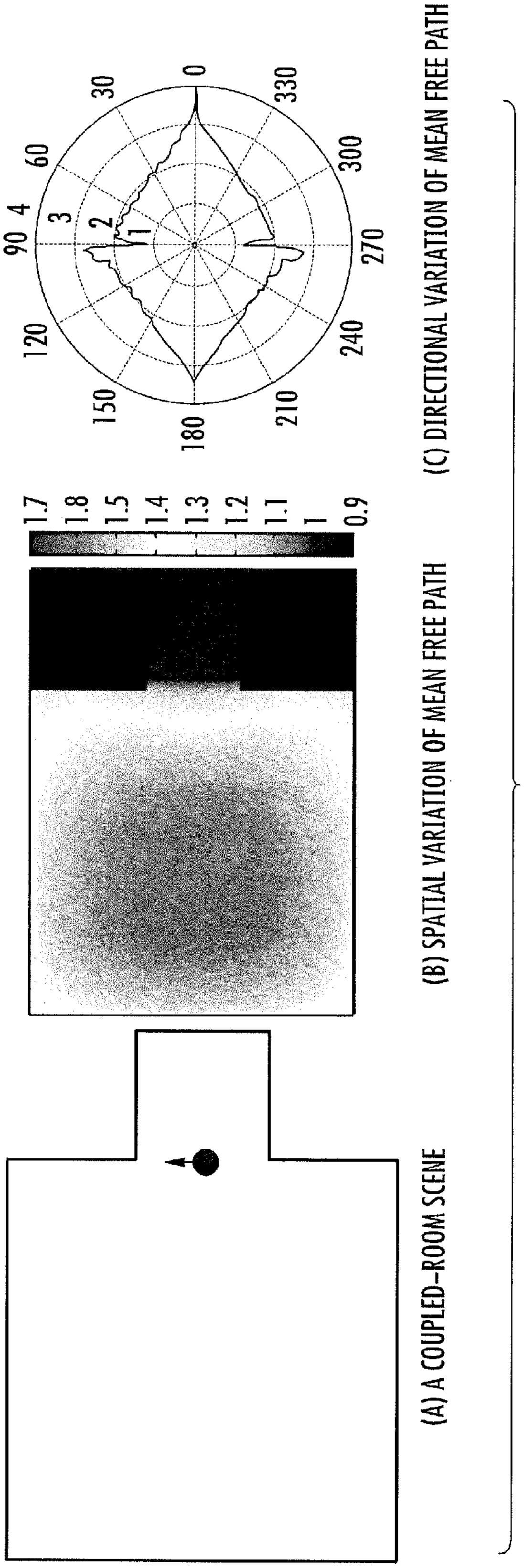
FIG. 2 illustrates spatial and directional variation of mean free path. 2(*a*) illustrates a 3 m×3 m×1 m room adjacent to a 1 m×1 m×1 m room, 2(*b*) illustrates variation of mean free path over the two-room scene, with varying listener position. The different shading in FIG. 2(*b*) indicates mean free path in meters. Note the smooth transition between mean free paths (and hence, between reverberation times) at the doorway connecting the two rooms. 2(*c*) illustrates variation of mean free path with direction of incidence at the listener position indicated by the dot, with the listener's orientation indicated by the arrow, The difference between the left and right lobes, due to the different sizes of the rooms on either side, indicates that more reverberant sound should be received from the left than from the right.

The mean free path varies with listener position in the scene, as shown in FIG. 2. A straightforward approach for computing the mean free path would be to use path tracing to sample a large number of multi-bounce paths, and compute the mean free path from first principles. However, like ambient occlusion, we only use local visibility and depth information. We define a function l (ω), which denotes the distance from the listener to the nearest surface along direction ω. We integrate over a unit sphere centered at the listener's position to determine the local distance average, $\bar{l}$:

$$\bar{l} = \frac{1}{4\pi}\int l(\omega)d\omega \quad (5)$$

Figure 3:
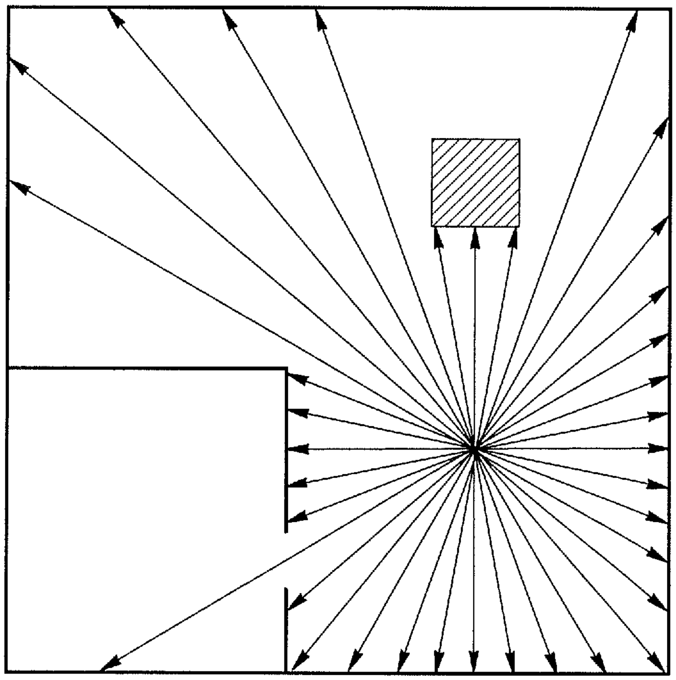
FIG. 3 illustrates sampling directions around a listener to determine a local distance average. In this top-down view, solid black denotes a solid surface. The arrows denote rays traced to sample distance from a point listener at the (common) origin of the rays.

FIG. 3 illustrates this process. This approach is similar in spirit to the process of integrating a visibility function when computing ambient occlusion. The above integral is evaluated using Monte Carlo integration. We trace rays out from the listener, and average the distance travelled by each ray, denoting the result by $\bar{l}$. A reference reverberation time $T_0$ is specified for the scene; we use this to determine a reference mean free path $\mu_0$ as per Equation 4.

We then blend the user-controlled mean free path $\mu_0$ and the local distance average $\bar{l}$:

$$\mu=\beta\bar{l}+(1-\beta)\mu_0 \quad (6)$$

where $\beta\in[0,1]$ is the local blending weight, and μ is the adjusted mean free path. While β may be directly specified to exaggerate or downplay the spatial variation of reverberation, we describe a systematic approach for determining β based on surface absorption.

Suppose reverberated sound undergoes n reflections before bouncing to the listener. Therefore, the distance traveled before the final bounce is (on average) $n\mu_0$, and the total distance traveled upon reaching the listener is (on average) $\bar{l}+n\mu_0$. Averaging over all n+1 bounces yields:

$$\mu = \frac{1}{n+1}\bar{l} + \frac{n}{n+1}\mu_0, \quad (7)$$

$$\beta = \frac{1}{n+1}. \quad (8)$$

Intuitively, the linear combination of Equation 6 serves to update an average—the mean free path—with the data given by the local distance average. As per the definition of $RT_{60}$ [12], sound energy decays by 60 dB after undergoing n bounces. Each bounce reduces sound energy by a factor of α. Therefore:

$$(1-\alpha)^n = 10^{-6}, \quad (9)$$

$$n = \frac{-6\log 10}{\log(1-\alpha)} \quad (10)$$

The above expressions allow the reverberation time to be efficiently adjusted as a function of the local distance average and surface absorption properties.

3.4 Directional Reverberation

Mean free paths also vary with direction of incidence, as shown in FIG. 2 The above technique can be easily generalized to obtain direction-dependent reverberation times from a single user-controlled reverberation time. We express μ as a function of incidence direction ω:

$$\mu(\omega)=\beta l(\omega))+(1-\beta)\mu_0 \quad (11)$$

Here μ(ω) denotes the average distance that a ray incident at the listener along direction ω travels between successive bounces. As before, l(ω) is computed using Monte Carlo sampling from the listener position. We then use a spherical harmonics representation of l to obtain directional reverberation, since spherical harmonics are well-suited for representing smoothly-varying functions of direction.

Spherical harmonics (SH) are a set of basis functions used for representing functions defined over the unit sphere. SH bases are widely used in computer graphics to model the directional distribution of radiance [25]. The basis functions are defined as [24];

$$Y_{p,q}(\theta,\phi) = N_{p,q}e^{iq\phi}P_{p|q|}(\cos\theta), \quad (12)$$

$$N_{p,q} = \sqrt{\frac{(2p+1)(p-|q|!}{4\pi(p+|q|)!}}, \quad (13)$$

where $p \in N$, $-p \le q \le p$, $P_{p,q}$ are the associated Legendre polynomials, and $\omega=(\theta,\phi)$ are the elevation and azimuth, respectively. Here, p is the order of the SH basis function, and represents the amount of detail captured in the directional variation of a function. Guided by the above definitions, we project $\mathbf{1}(a)$ into a spherical harmonics basis:

$$l(\omega)=\Sigma_{p=0}^{P}\Sigma_{q=-p}^{P} l_{p,q} Y_{p,q}(\omega), \tag{14}$$

$$\mu(\omega)=\Sigma_{p=0}^{P}\Sigma_{q=-p}^{P} \mu_{p,q} Y_{p,q}(\omega). \tag{15}$$

The linearity of spherical harmonics allows us to independently adjust the SH coefficients of the mean free path:

$$\mu_{p,q}=\beta l_{p,q}+(1-\beta)\mu_0. \tag{16}$$

These SH representations of the adjusted mean free path can then be evaluated at any speaker position (as per Equation 15) to determine the reverberation time for the corresponding channel. Alternately, we can use the Ambisonics expressions for amplitude panning weights [18] to directly determine the contribution of the $l_{p,q}$ terms at each speaker position. For example, with first-order SH and N speakers, we use:

$$l_i = \frac{1}{N}\sum_j (1 - 2\omega_j \cdot \omega_i), \tag{17}$$

where $i \in [0,N-1]$ are the indices of the speakers, the indices j range over the number of rays traced from the listener, $\omega_j$ are the ray directions, and $\omega_j$ are the directions of the speakers relative to the listener. We can then evaluate a reverberation time for each speaker:

$$\mu_i=\beta l_i+(1-\beta)\mu_0. \tag{18}$$

This enables realistic directional reverberation on a variety of speaker configurations, ranging from stereo to 5.1 or 7.1 home theater systems.

4 Early Reflections Estimation

In addition to reverberation, we also wish to model early reflections of sound, for the purposes of improved immersion and spatial localization of sound sources, State-of-the-art techniques for interactively (12) modeling reflected sound are based on the image source method [2]. This method involves determining virtual image sources which represent reflected sound paths reaching the listener from the source. To determine the positions of the image sources, and which image sources contribute reflected sound to the listener, rays are traced from the source position, and recursively from each of the image sources, Such multi-bounce ray tracing is possible in real-time [29] for up to around 4-5 orders of reflections. However, with all existing real-time ray tracers, achieving such a level of performance requires dedicating significant computational resources (a large number of CPU cores, or most, if not all, of the compute units on a GPU) solely to the audio pipeline. These computational demands cannot be practically met by modern game engines, that require most of the computational resources to be dedicated to rendering, physics simulation, or AI. Hence, we propose an approximate approach which demands significantly fewer computational resources.

Our approach only traces single-bounce rays, which can be used to compute image sources for first-order reflections. We next describe a local model for extrapolating from first-order image sources to higher-order image sources. This approach does not require tracing additional rays to compute higher-order reflections, and hence has a lower computational overhead than ray-tracing-based image source methods.

4.1 Local Model for Reflection Estimation

Our local model is based on the observation that in a rectangular (or shoebox) room, image sources are never occluded, and their positions can be computed by reflections about one of six planes, without having to trace any rays. In fact, in a rectangular room, the superposition of sound fields induced by the image sources obtained using this approach is an analytical solution of the wave equation in the scene [2].

We begin by fitting a shoebox to the local geometry around the listener. We consider the hit points of all the ray traced from the listener during reverb estimation, and perform a cube map projection. This process bins each of the hit points to one of the six cube faces. Suppose the set of hit points binned to one particular cube face (with normal n) is denoted by $\{d_i,n_i,\alpha_i)\}$, where $d_i$ is the projection depth of the $i^{th}$ hit point, $n_i$ is the surface normal at the hit point, and $\alpha_i$ is the absorption coefficient of the surface at the hit point. We use this information to compute the following aggregate properties for the cube face:

Depth: We average the depths of the hit points:

$$d=[d_i], \tag{19}$$

(where [•] denotes the averaging operator) to determine the average depth of the cube face from the listener along the appropriate coordinate axis.

Absorption: We similarly average the absorption coefficients of the hit points;

$$\alpha=[\alpha_1], \tag{20}$$

to determine the absorption coefficient of the cube face. Note that this process automatically assigns higher weights to the absorption coefficients of surfaces with greater visible surface area (as seen from the listener's position).

Scattering In complex scenes, the surface normals $n_i$ are likely to deviate to a varying extent from the cube face normal n, assuming the cube face to be perfectly planar is likely to result in excess reflected sound being computed. To address this issue, we compute a scattering coefficient a for the cube face, which describes the fraction of non-absorbed sound that is reflected in directions other than the specular reflection direction. Specifically, we compute the random-incidence scattering coefficient, which is defined as the fraction of reflected sound energy that is scattered away from the specular reflection direction, averaged over multiple incidence directions [34].

For any given incidence direction, a surface patch reflects sound in the specular direction for the cube face only if the local surface normal of the patch is aligned with the surface normal of the cube face. We define an alignment indicator function, $\chi_n$, such that $\chi_n(n_i)=1$ if and only if $\|n \cdot n_i - 1\| \le \epsilon$, and 0 otherwise, where $\epsilon$ is some suitably chosen tolerance. Since the total energy reflected from each hit point is $\Sigma_i(1-\alpha_i)$, we get:

$$\sigma = 1 - \frac{\Sigma_i(1-\alpha_i)\chi_n(n_i)}{\Sigma_i(1-\alpha_i)}, \tag{21}$$

which we use as our scattering coefficient.

Note that we cannot use the listeners local coordinate axes for projection, since this would result in the shoebox dimensions varying even if the listener rotates in-place, resulting in an obvious instability in the reflected sound field. Hence, we use the world-space coordinate axes for projection.

4.2 Image Source Extrapolation

Given the local shoebox proxy, we can quickly extrapolate from first-order reflections to higher-order reflections. We take the first-order image sources computed using ray tracing, and recursively reflect them about the faces of the proxy shoebox, yielding higher-order image sources. This process efficiently constructs approximate higher-order image sources. The image sources computed by this approach also have the important property that the directions of the higher-order image sources relative to the listener are plausibly approximated, i.e., if reflected sound is expected to be heard from the listeners right, the approximation tends to contain a reflection reaching the listener from the right. This is because geometry lying (say) to the right of the listener is mapped to a proxy face which also lies to the right of the listener. Therefore, the relative positions of two objects or surfaces roughly correspond to the relative positions of the proxy faces they are mapped to. (See the accompanying video for more.)

To account for absorption and surface normal variations, after each order of reflection, the strengths of the image sources are scaled by $(1-\alpha)(1-\sigma)$, where $\alpha$ is the absorption coefficient of the face about which the image source was reflected, and $\sigma$ is its scattering coefficient.

5 Results

In this section, we present experimental results of the performance of our implementation, and analyze the results.

5.1 Implementation

Figure 4:
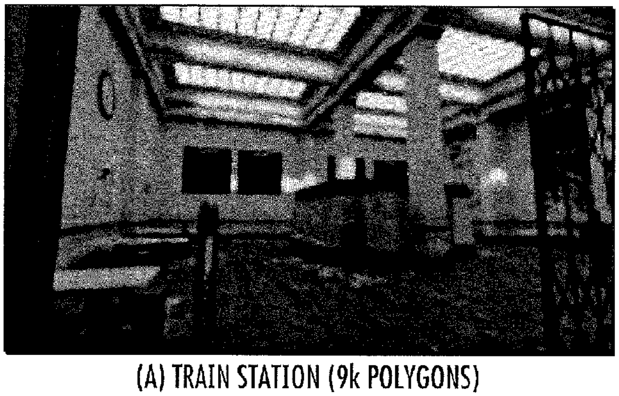
FIG. 4 includes photographs illustrating benchmark scenes used during experimentation.
Figure 4:
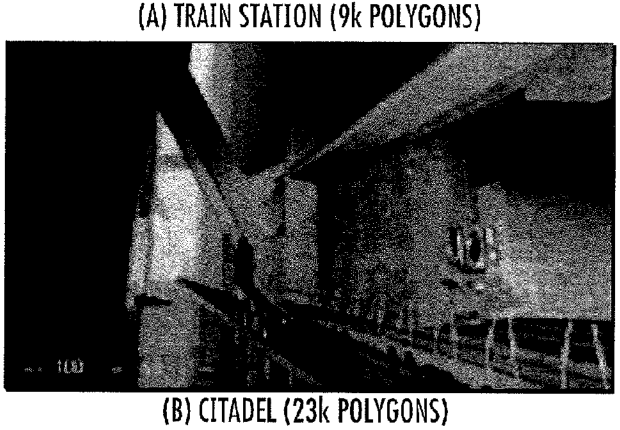
Figure 4:
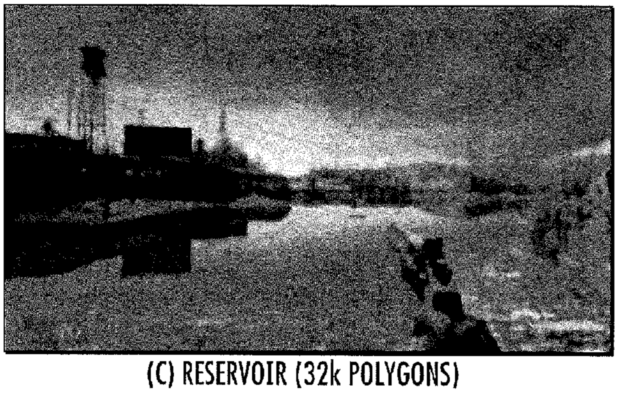
Figure 4:
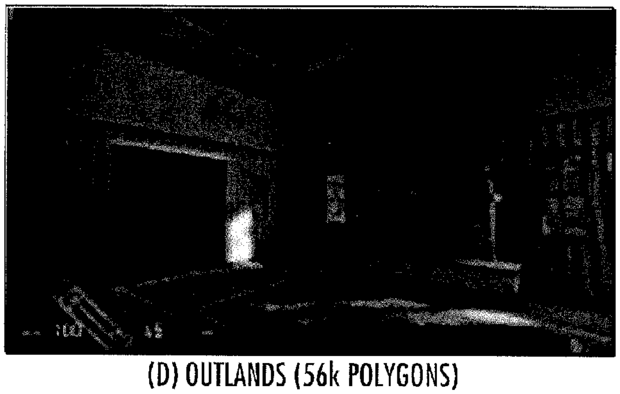

We have integrated our approach into Valve's Source game engine. Sound is rendered using Microsoft's XAudio2 API. Ray tracing, mean free path estimation, proxy generation, and impulse response computation are performed continuously in a separate thread; the latest estimates are used to configure XAudio2's artificial reverberators for each channel as well as a per-channel convolution unit. Intel Math Kernel Library is used for convolution. All experiments were performed on an Intel Xeon X5560 with 4 cores and 2 GB of RAM running Windows Vista; our implementation uses only a single CPU core. FIG. 4 shows the benchmark scenes used in our experiments. These are indoor and outdoor scenes with dynamic objects (e.g. moving doors).

5.2 Performance

Table 1 shows the time taken to perform the integration required to estimate mean free path. Our implementation uses the ray tracer built into the game engine, which is designed to handle only a few ray shooting queries arising from firing bullet weapons and from GUI picking operations; it is not optimized for tracing large batches of rays. Nonetheless, we observe high performance, indicating that our method is suitable for use in modern game engines running on current commodity hardware. Given the local distance average, the final mean free path and $RT_{60}$ estimate is computed within 1-2 μs.

TABLE 1

Performance of local distance average estimation.

| Scene | Polygons | Ray Samples | Time (ms) |
|---|---|---|---|
| Train Station | 9110 | 1024 | 7.88 |
| Citadel | 23231 | 2048 | 8.94 |
| Reservoir | 31690 | 1024 | 10.79 |
| Outlands | 55866 | 1024 | 4.59 |

The complexity of the integration step is O(k log n), where k is the number of integration samples (rays) and n is the number of polygons in the scene. For low values of k, we expect very high performance with a modern ray tracer.

The time required to generate the proxy is scene-independent. In practice we observe around 0.9-1.0 ms for generating the proxy using 1024 samples; the cost scales linearly in the number of samples. Table 2 compares the performance of constructing higher-order image sources using our method to the time required by a reference ray-tracing-based image source method. The performance of our method is independent of scene complexity, whereas the image source method incurs increased computational overhead in complex scenes.

TABLE 2

Performance of proxy-based higher-order reflections, compared to reference image source method. Column 2 indicates the orders of reflection, Column 3 indicates time taken by our approach, and Column 4 indicates time taken by the ray-tracing-based image source method to compute the reference solution.

| Scene | Refl. Orders | Time (ms) | Ref. Time (ms) |
|---|---|---|---|
| Outlands | 2 | 0.005 | 380 |
| | 3 | 0.010 | 3246 |
| Reservoir | 2 | 0.004 | 101 |
| | 3 | 0.009 | 656 |
| Citadel | 2 | 0.01 | 341 |
| | 3 | 0.02 | 3289 |
| Train Station | 2 | 0.005 | 30 |
| | 3 | 0.015 | 223 |
| | 4 | 0.049 | 1689 |

5.3 Analysis

Figure 5:
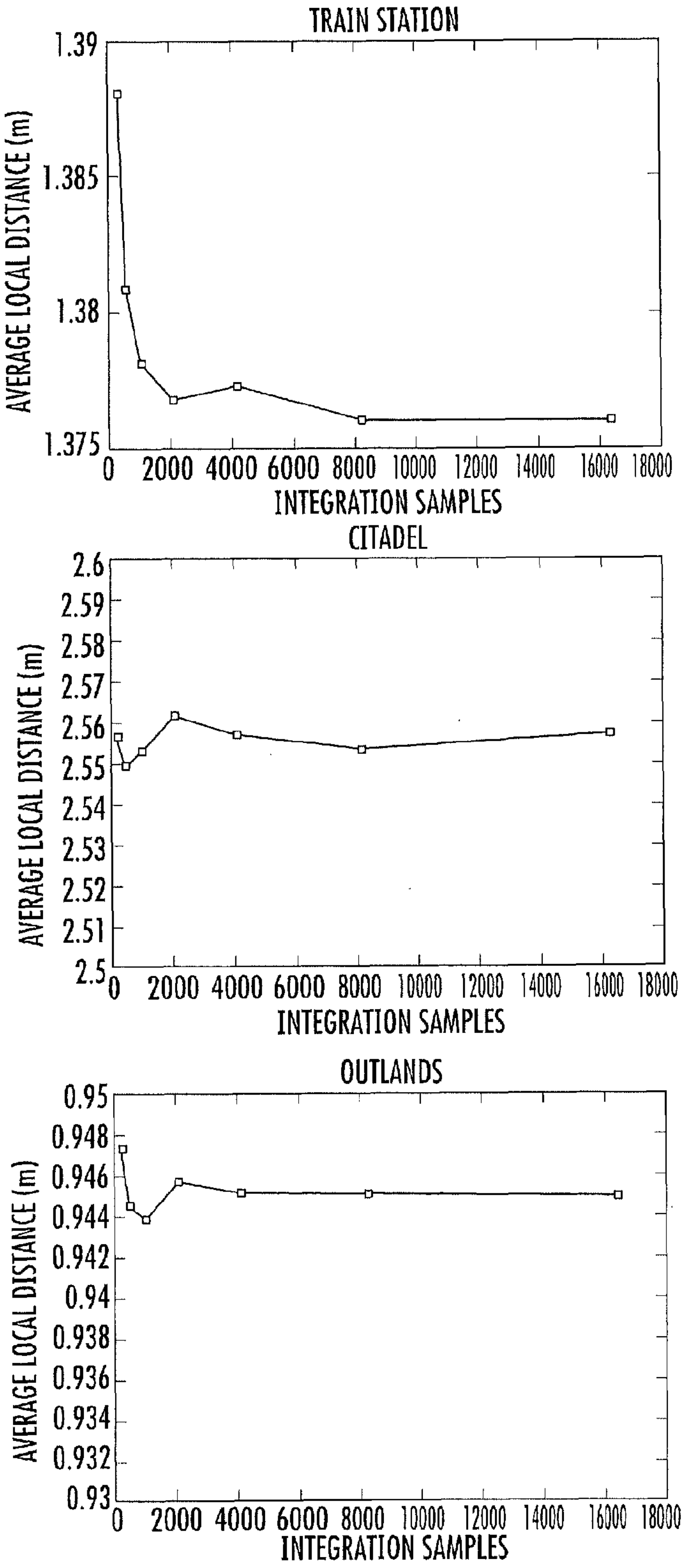
FIG. 5 consists of graphs illustrating convergence of local distance average estimate according to embodiment of the subject matter described herein.

FIG. 5 plots the estimated local distance average as a function of the number of rays traced from the listener, for different scenes. For clarity, the local distance average is computed by integrating over the unit sphere, without directional weights. The plots demonstrate that tracing a large number of rays is not necessary; the local distance average quickly converges with only a small number of rays (1-2K); and can be evaluated very efficiently, even in large, complex scenes.

Figure 8:
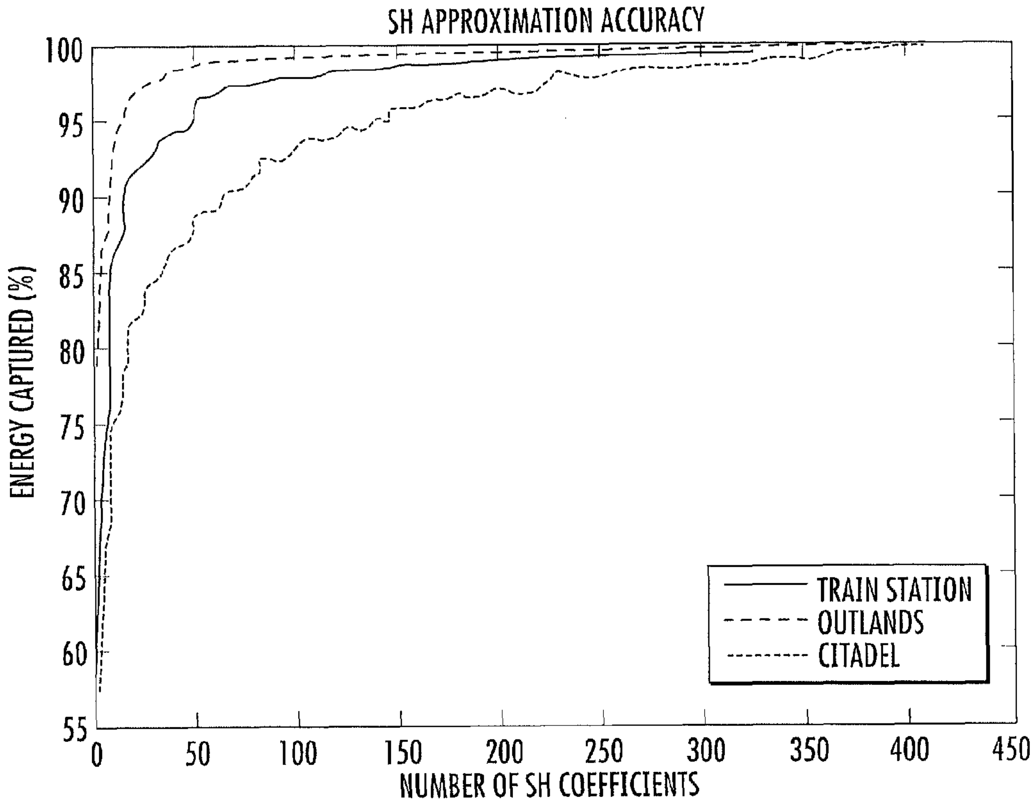
FIG. 8 is a graph illustrating accuracy of representing the local distance function in spherical harmonics, as a function of the number of SH coefficients according to an embodiment of the subject matter described herein.

FIG. 8 illustrates the accuracy of a spherical harmonics representation of the local distance function, for different scenes. The figure shows the percentage of energy captured in the spherical harmonics representation as a function of the number of coefficients, up to order 20 (i.e., p=20). The figure clearly shows that very few coefficients are required to capture most of the directional variation (75-80%).

Figure 6:
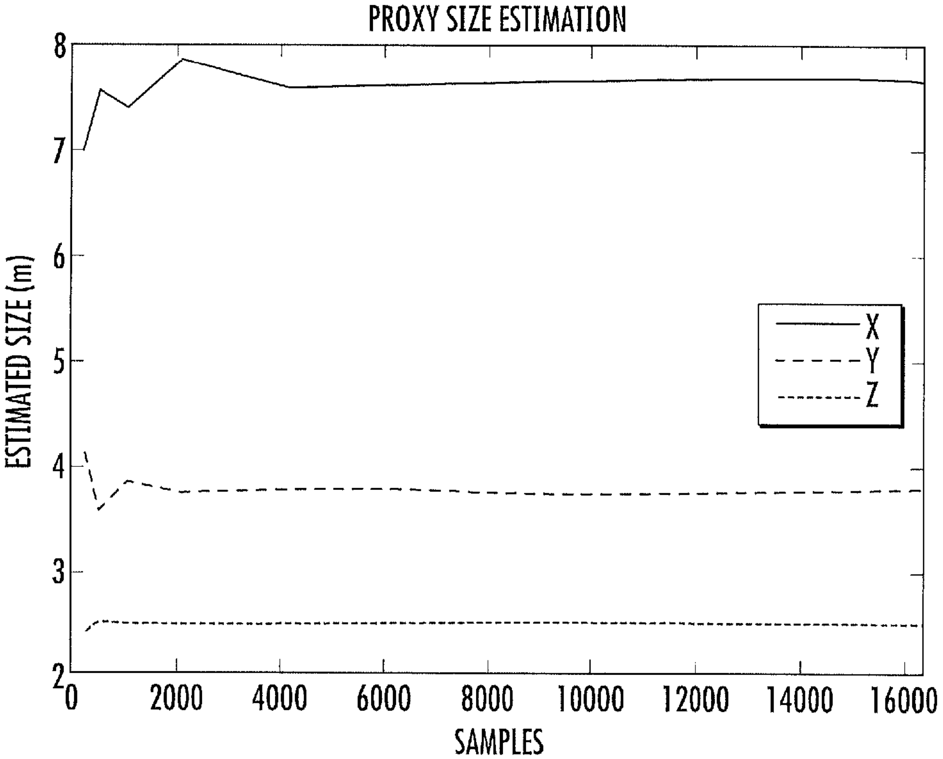
FIG. 6 is a graph illustrating convergence of proxy size estimation. The individual curves show the estimates for the X, Y, and Z dimensions of the proxy computed at a particular listener position in the Citadel scene.

FIG. 6 plots the estimated dimensions of the dynamically generated rectangular proxy as a function of the number of rays traced, for a given listener position in the Citadel scene. For example, the curve labeled "X" plots the difference (in meters) between the estimated world-space positions of the +X and −X faces of the proxy. The other two curves plot analogous quantities for the Y and Z axes. The plot shows that the estimated depths of the cube faces converge quickly, allowing us to trace fewer rays at run-time.

5.4 Comparison

Figure 7:
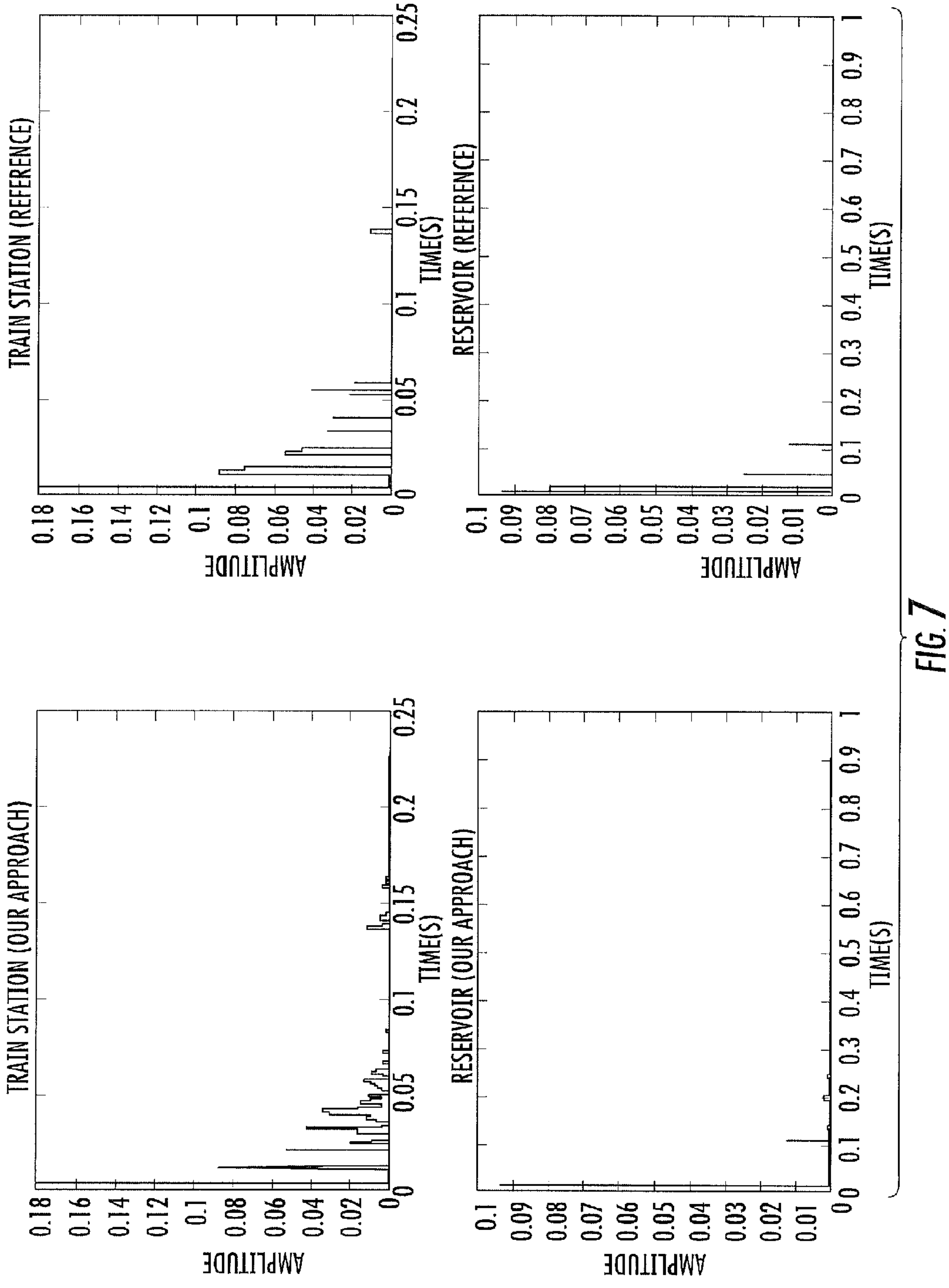
FIG. 7 includes comparison graphs illustrating impulse responses generated by the method described herein and a reference image source method.

FIG. 7 compares the impulse responses generated by our method against those generated by a reference ray-tracing-based image source method. In all cases, we computed up to 3 orders of reflection, with a maximum impulse response length of 2.0 seconds. For the reference image source method, we traced 16K primary rays from the source position, and 32 secondary rays recursively from each image source. For our method, we traced 16K primary rays from the source position to generate the rectangular proxy, which we then used to generate higher-order reflections. In all cases, the source and listener were placed at the same position.

In the case of the Train Station scene, our approach generates extraneous low-amplitude contributions, while retaining a similar overall decay profile. The larger number of contributions arises because our method maps many surfaces which do not actually contribute specular reflections at the listener to the same cube face. This leads to many more higher-order image sources being generated as compared to the reference method. The amplitudes of these contributions are lower since the estimated scattering coefficients compensate for the large variation in local surface normals over the proxy faces by reducing the amplitude of the reflected sound.

In the case of the Reservoir scene, our approach misses a reflection peak which can be seen in the reference impulse response (see FIG. 7). This is most likely a higher-order reflection from one of the rocks (which are small relative to the rest of the scene). Our approach cannot model higher order reflections from relatively small, distinct features such as the rocks in this scene, since the dimensions of the rectangular proxy are dominated by the distant cliffs and terrain in this scene, which occupy a larger visible projected surface area with respect to the listener position.

In the accompanying video, we also compare the directionally-varying reverberation generated by our method against a simple static reverberation filter, as used in current game engines and VR systems. The video clearly demonstrates that our method is able to create a richer, more immersive reverberant sound field with reduced designer effort, as compared to the state-of-the-art.

5.5 Evaluation

We have performed a preliminary user study to compare the quality of early reflections generated by our approach against those generated by a reference ray-tracing-based image source method. The study involves 16 pairs of video clips showing the same sound clips (gunshots) rendered within an environment. For each of our benchmark scenes, we generated 4 pairs of sound clips. Two of these pairs contained one clip each from our method and the reference method. The remaining two pairs either contained two identical clips generated using the reference method, or two identical clips generated using our method. The ordering of clips was randomized for each participant. For each pair of clips, participants were asked to rate a) which clip they considered more immersive, and b) which clip they thought matched better with the visual rendering. Both answers were given on a scale of Ito 10, with 1 meaning the first clip in the pair was preferred strongly, and 10 meaning the second clip in the pair was preferred strongly.

Table 3 tabulates the results of this user study, gathered from 20 participants. Question 1 refers to the question regarding overall level of realism. Question 2 refers to the question regarding correlation with the visual rendering. For question and for each scene, the table provides the mean and standard deviation of the scores for three groups of questions. The first group, denoted REF/REF, contains video pairs containing two identical clips generated using the reference method. The second group, denoted OUR/OUR, contains video pairs containing two identical clips generating using our method. The third group, denoted REF/OUR, contains video pairs containing one clip generated using the reference method, and one clip generated using our method. In this group, low scores indicate a preference for the reference method, and high scores indicate a preference for our method.

TABLE 3

Results of our preliminary user study. For each question and for each scene, we tabulate the mean and standard deviations of the responses given by the participants. The columns labeled REF/REF are the scores for questions involving comparisons between two identical clips generated using the reference image source method. The columns labeled OUR/OUR are the scores for questions involving comparisons between two identical clips generated using our approach. The columns labeled REF/OUR are the scores for questions involving comparisons between our approach and the reference approach.

| | | REF/REF | | OUR/OUR | | REF/OUR | |
|---|---|---|---|---|---|---|---|
| Question | Scene | Mean | Std, Dev. | Mean | Std, Dev. | Mean | Std, Dev. |
| 1 | Citadel | 5.3 | 0.99 | 5.9 | 0.97 | 5.3 | 1.88 |
| | Outlands | 5.6 | 0.99 | 6.1 | 1.14 | 5.1 | 1.43 |
| | Reservoir | 5.8 | 1.29 | 6.0 | 2.11 | 5.5 | 2.35 |
| | Train Station | 6.2 | 1.6 | 6.2 | 1.09 | 5.6 | 2.13 |
| 2 | Citadel | 5.3 | 1.24 | 5.8 | 1.06 | 5.5 | 2.02 |
| | Outlands | 5.6 | 0.83 | 6.0 | 1.02 | 5.4 | 1.43 |
| | Reservoir | 5.8 | 1.33 | 5.7 | 2.13 | 5.2 | 2.26 |
| | Train Station | 6.1 | 1.43 | 5.8 | 1.21 | 5.3 | 1.98 |

As the results demonstrate, most participants did not exhibit a strong preference for either of the clips in any pair, since most of the mean scores are between 5 and 6. This indicates that the participants felt that our method generates results that are comparable to the reference method with respect to the subjective criteria of realism and correlation with visuals, However, this is a preliminary user study; we plan to perform a more extensive and detailed evaluation of our technique in the future.

6 Limitations and Conclusions

The subject matter described herein includes an efficient technique for approximately modeling sound propagation effects in indoor and outdoor scenes for interactive applications. The technique is based on adjusting user-controlled reverberation parameters in response to the listener's movement within a virtual world, as well as a local shoebox proxy for generating early reflections with a plausible directional distribution. The technique generates immersive directional reverberation and reflection effects, and can easily scale to multi-channel speaker configurations. It is easy to implement and can be easily integrated into any modern game engine, without significantly re-architecting the audio pipeline, as demonstrated by our integration with Valve's Source engine.

Our reverberation approach does not account for spatially-varying surface absorption properties; however, this is a limitation of the underlying statistical model. Our approach for modeling reflections involves a coarse shoebox proxy; as a result the accuracy of the generated higher-order reflections depends on how good a match the proxy model is to the underlying scene geometry. Finally, since our reverberation approach does not perform global (multi-bounce) ray tracing, but involves a user-controlled reverberation time, it is subject to error in the adjusted mean free path.

There are many avenues for future work. One main challenge is to develop a method for incorporating multi-bounce ray tracing into the mean free path estimate in real-time, so as to generate more realistic reverberation. It would also be interesting to develop a more statistically-driven method for determining higher-order early reflections by using additional statistics computed over the faces of the shoebox model, such as those involving depth variance or normal directions. Further, it would be interesting to explore a more accurate approach for fitting shoebox proxies to scene geometry, based on projections along the principal axes of the point cloud of geometry samples obtained through ray tracing. Finally, we need to evaluate our approach in more game and VR scenarios and perform detailed user studies to evaluate its benefits.

Figure 9:
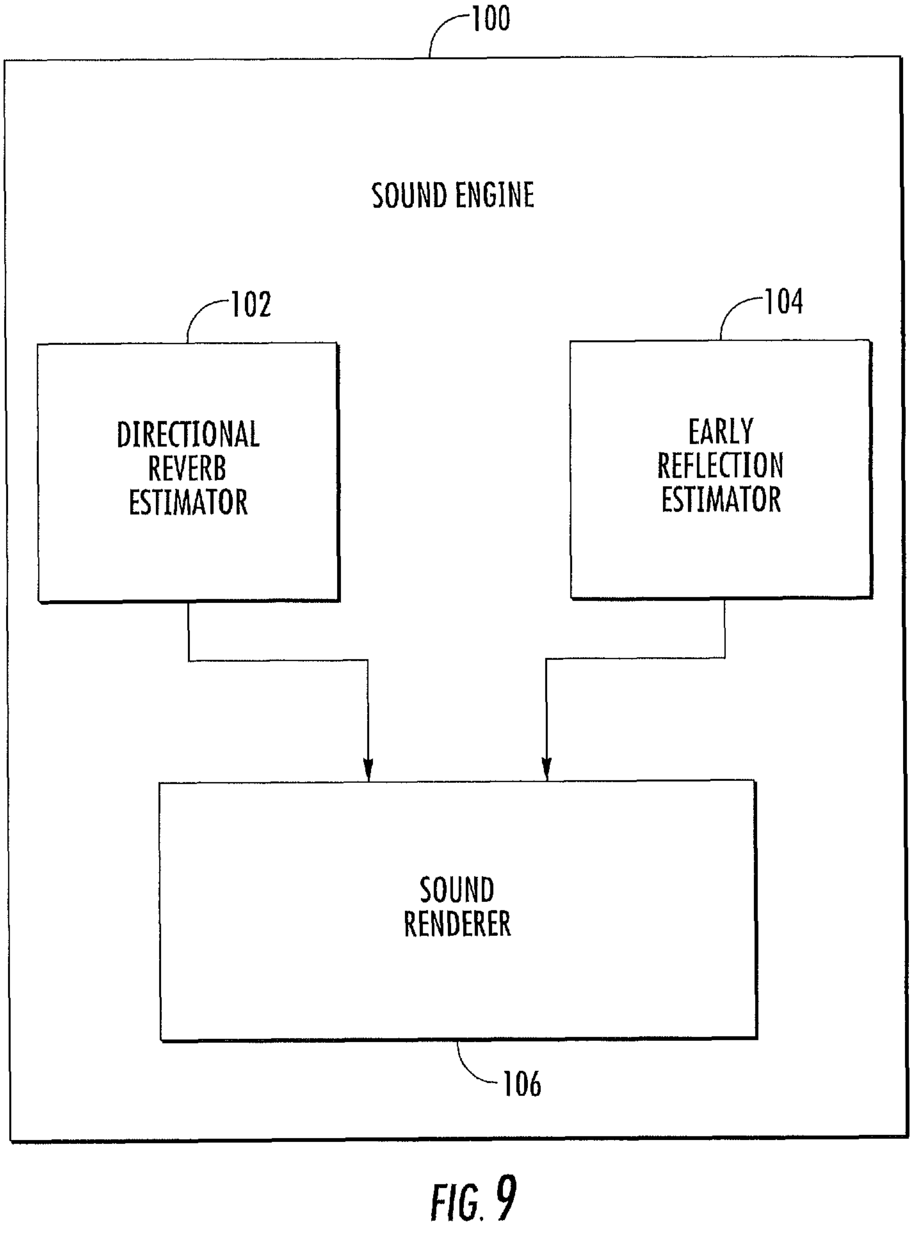
FIG. 9 is a block diagram illustrating a sound engine for estimating directional reverb and rendering sounds using the estimated directional reverb according to embodiment of the subject matter described herein.

FIG. 9 is a block diagram of an exemplary implementation of the subject matter described herein. In FIG. 9, a sound engine 100 includes a directional reverb estimator 102, an early reflection estimator 104, and a sound renderer 106. Directional reverb estimator 102 performs the steps described above for estimating directional reverberations at listener positions in a scene. Early reflection estimator 104 performs the steps described herein for estimating early reflections using aural proxies. Sound renderer 106 renders sound using the directional reverberation and early reflections estimated by modules 102 and 104. In one exemplary implementation, sound engine 100 may be a component of a processor that is optimized for video game or virtual reality applications.

Figure 10:
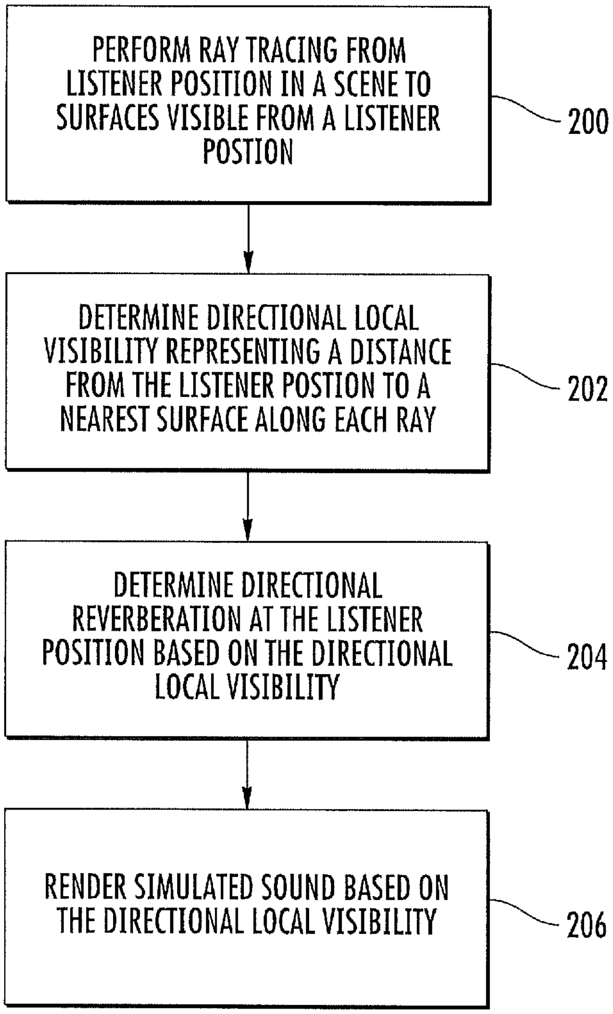
FIG. 10 is a flow chart illustrating an exemplary process for simulating directional sound reverberation according to an embodiment of the subject matter described herein.

FIG. 10 is a flow chart illustrating an exemplary process for simulating directional sound reverberation according to an embodiment of the subject matter described herein. Referring to FIG. 10, in step 200, ray tracing from a listener position in a scene to surfaces visible from the listener position is performed. In step 202, a directional local visibility representing a distance from the listener position to a nearest surface in the scene along each ray is determined. In step 204, directional reverberation at the listener position is determined based on the directional local visibility. In step 206, a simulated sound indicative of the directional reverberation at the listener position is rendered.

Figure 11:
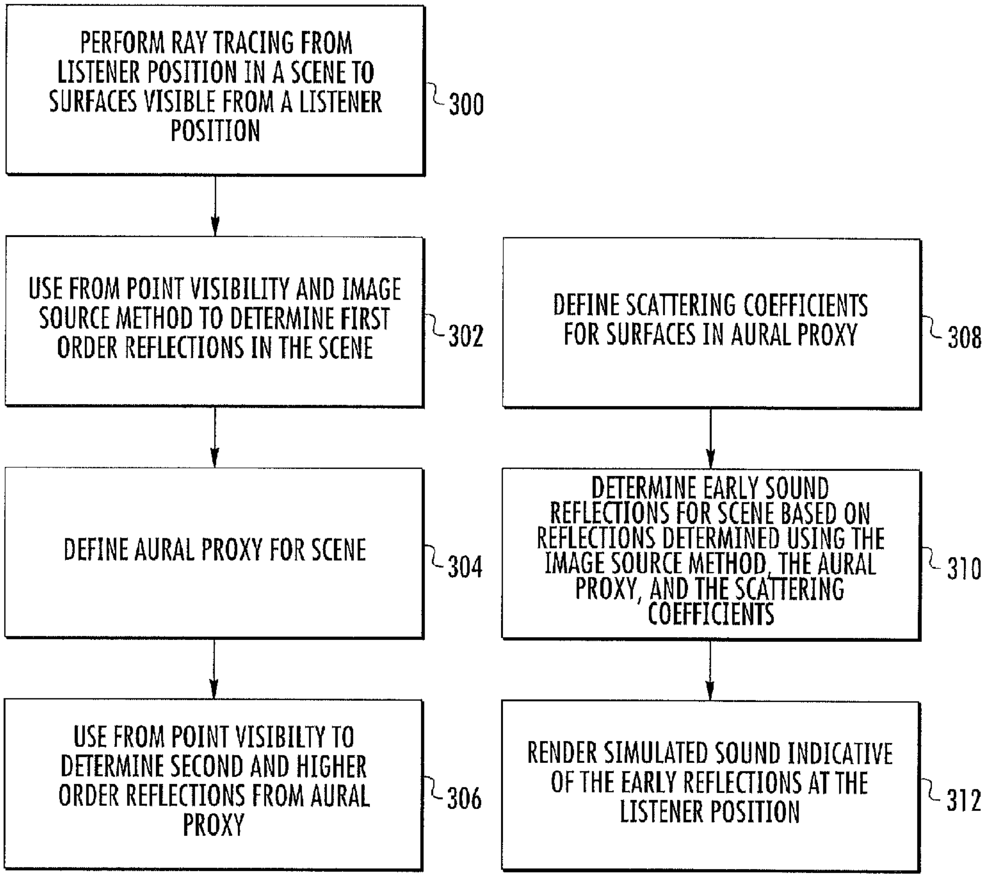
FIG. 11 is a flow chart illustrating an exemplary process for simulating early sound reflections according to an embodiment of the subject matter described herein.

According to another aspect, the subject matter described herein includes a method for simulating early sound reflections. FIG. 11 is a flow chart illustrating exemplary steps of such a method. Referring to FIG. 11, in step 300, ray tracing is performed from a listener position in a scene to surfaces visible from the listener position. In step 302, from point visibility and an image source method are used to determine first order reflections of each ray in the scene. In step 304, an aural proxy is defined for the scene. In step 306, from point visibility is used to determine second and higher order reflections from the aural proxy. In step 308, scattering coefficients for surfaces in the aural proxy are defined. In step 310, early sound reflections are determined for the scene based on the reflections determined using the image source method, the aural proxy, and the scattering coefficients. In step 312, a simulated sound indicative of the early reflections at the listener position is rendered.

It will be understood that various details of the presently disclosed subject matter may be changed without departing from the scope of the presently disclosed subject matter. Furthermore, the foregoing description is for the purpose of illustration only, and not for the purpose of limitation.

The disclosure of each of the following references is incorporated herein by reference in its entirety.

[1] D. Aliaga, J. Cohen, A. Wilson, E. Baker, H. Zhang, C. Erikson, K. Hoff, T. Hudson, W. Stuerzlinger, R. Bastos, M. Whitton, F. Brooks, and D. Manocha. Mmr: an interactive massive model rendering system using geometric and image-based acceleration. In *Proc, Symposium on Interactive* 3*D Graphics*, pages 199-206, 1999,

[2] J. B. Allen and D. A. Berkley. Image method for efficiently simulating small-room acoustics. *J. Acoustical Society of America,* 65(4):943-950, 1979.

[3] L. Antani, A. Chandak, L. Savioja, and D. Manocha. Interactive sound propagation using compact acoustic transfer operators. *ACM Trans. Graphics,* 31(1):7:1-7:12, 2012.

[4] R. S. Bailey and B. Brumitt. Method and system for automatically generating world environment reverberation from game geometry. U.S. Patent Application 20100008513, 2010.

[5] J. Blauert. *Spatial Hearing: The Psychophysics of Human Sound Localization.* MIT Press, 1983.

[6] X. Decoret, F. Durand, F. Sillion, and J. Dorsey, Billboard clouds for extreme model simplification. *ACM Trans. Graphics,* 22(3):689-696, 2003.

[7] C. F. Eyring. Reverberation time in dead rooms, .1. *Acoustical Society of America,* 1:217-241, 1930.

[8] T. Funldiouser, I. Carlbom, G. Elko, G. Pingali, M. Sondhi, and J. West. A beam tracing approach to acoustic modeling for interactive virtual environments. In *Proc. SIGGRAPH* 1998, pages 21-32, 1998.

[9] N. A. Gumerov and R. Duraiswami. A broadband fast multipole accelerated boundary element method for the three-dimensional helmholtz equation. *J. Acoustical Society of America,* 125(1):191-205, 2009.

[10] IASIG. Interactive 3d audio rendering guidelines, level 2.0. http://www.iasig.org/pubs/3d12v1a.pdf, 1999.

J.-M. Jot and A. Chaigne. Digital delay networks for designing artificial reverberators. In *AES Convention,* 1991.

[11] H. Kuttruff. *Room Acoustics*. Spun Press, 2000.

[12] H. Landis. Global illumination in production. In *S1GGRAPH Course Notes,* 2002.

[13] P. Larsson, D. Vastfjall, and M. Kleiner. Better presence and performance in virtual environments by improved binaural sound rendering, In *AES International Conference on Virtual, Synthetic and Entertainment Audio,* 2002.

[14] P. Larsson, D. Vastfjall, and M. Kleiner. On the quality of experience: A multi-modal approach to perceptual egomotion and sensed presence in virtual environments. In *ISCA 1TRW on Auditory Quality of Systems,* 2003.

[15] B. Loos, L. Antani, K. Mitchell, D. Nowrouzezahrai, W. Jarosz, and P.-P. Sloan. Modular radiance transfer. *ACM Trans. Graphics,* 30(6), 2011.

[16] P. C. W. Maciel and P. Shirley. Visual navigation of large environments using textured clusters. In *Proc. Symp. on Interactive* 3*D Graphics,* 1995.

[17] V. Pulldd *Spatial sound generation and perception by amplitude panning techniques*. PhD thesis, Helsinki University of Technology, 2001.

[18] N. Raghuvanshi, R. Narain, and M. C. Lin. Efficient and accurate sound propagation using adaptive rectangular decomposition. *IEEE Trans. Visualization and Computer Graphics,* 15(5):789-801, 2009.

[19] N. Raghuvanshi, J. Snyder, R. Mehra, M. C. Lin, and N. Govindaraju. Precomputed wave simulation for real-time sound propagation of dynamic sources in complex scenes. *ACM Trans. Graphics,* 29(4), 2010.

[20] G. Schuller, Dynamically generated impostors. In *GI Workshop on Modeling, Virtual Worlds,* 1995.

[21] P. Shanmugam and 0. Arikan. Hardware accelerated ambient occlusion techniques on gpus. In *Proc. Symposium on Interactive* 3*D Graphics,* 2007.

[22] S. Siltanen, T. Lokki, S. Kiminki, and L. Savioja. The room acoustic rendering equation. *J. Acoustical Society of America,* 122(3):1624-1635, 2007.

[23] E-P. Sloan. Stupid spherical harmonics tricks. In *Game Developers Conference,* 2008.

[24] P.-P. Sloan, J. Kautz, and J. Snyder. Precomputed radiance transfer for real-time rendering in dynamic, low-frequency lighting environments. In *SIGGRAPH,* 2002.

[25] R. L. Storms. *Auditory-Visual Cross-Modal Perception Phenomena*. PhD thesis, Naval Postgraduate School, 1998.

[26] U. P. Svensson, R. I. Fred, and J. Vanderkooy. An analytic secondary source model of edge diffraction impulse responses. *J. Acoustical Society of America,* 106(5):2331-2344, 1999.

[27] A. Taflove and S. C. Hagness. Computational Electrodynamics: *The Finite-Difference Time-Domain Method*. Artech House, 2005,

[28] M. Taylor, A. Chandalc, Q. Mo, C. Lauterbach, C. Schissler, and D. Manocha. Guided multiview ray tracing for fast auralization. *IEEE Trans. Visualization and Computer Graphics*, to appear.

[29] L. L. Thompson. A review of finite-element methods for time-harmonic acoustics. *J. Acoustical Society of America,* 119(3):1315-1330, 2006.

[30] N. Tsingos. Pre-computing geometry-based reverberation effects for games. *In AES Conference on Audio for Games,* 2009.

N. Tsingos, T. Furfichouser, A. Ngan, and I. Carlbom. Modeling acoustics in virtual environments using the uniform theory of diffraction. In *Proc. SIGGRAPH* 2001, pages 545-552, 2001.

[33] M. Vorlander. Simulation of the transient and steady-state sound propagation in rooms using a new combined ray-tracing/image-source algorithm. *J. Acoustical Society of America,* 86(1):172-178, 1989.

[34] M, Vorlander and E. Mommertz. Definition and measurement of random-incidence scattering coefficients. *Applied Acoustics,* 60(2):187-199, 2000.

S. Zhukov, A. Inoes, and G. Kronin. An ambient light illumination model. In *Rendering Techniques*, pages 45-56, 1998.

What is claimed is:

1. A method for simulating directional sound reverberation, the method comprising:

performing ray tracing from a listener position in a scene to surfaces visible from the listener position;

determining a directional local visibility representing a distance from the listener position to a nearest surface in the scene along each ray;

determining directional reverberation at the listener position based on the directional local visibility, wherein determining the directional reverberation based on the directional local visibility includes:

determining a reference mean free path representing an average distance traveled between successive reflections along each ray;

determining a directional mean free path based on the directional local visibility and the reference mean free path; and determining the directional reverberation at the listener position based on the directional mean free path; and wherein determining the directional reverberation includes determining a reverberation time from the directional mean free path and determining the directional reverberation using the reverberation time; and rendering a simulated sound indicative of the directional reverberation at the listener position.

2. The method of claim 1 wherein determining a directional mean free path includes determining a user controlled mean free path by weighting the directional local visibility relative to the reference mean free path.

3. The method of claim 1 wherein determining a reverberation time includes adjusting the reverberation time as a function of local average distance and surface absorption properties.

4. The method of claim 1 comprising representing the directional mean free path using spherical harmonics.

5. The method of claim 1 wherein rendering a simulated sound includes rendering a simulated sound in a video game or virtual reality environment.

6. A method for simulating early sound reflections, the method comprising:

performing ray tracing from a listener position in a scene to surfaces visible from the listener position;

using from point visibility and an image source method to determine first order reflections of each ray in the scene, wherein using the image source method includes performing ray tracing from virtual image sources, which represent the first order reflections, to identify the first order reflections that reach the listener position;

defining an aural proxy for the scene, wherein the aural proxy comprises a geometric shape that is fit to a local geometry around a listener;

using from point visibility to determine second and higher order reflections from the aural proxy;

defining scattering coefficients for surfaces in the aural proxy; and determining early sound reflections for the scene based on the reflections determined using the image source method, the aural proxy, and the scattering coefficients; and rendering a simulated sound indicative of the early reflections at the listener position.

7. The method of claim 6 wherein defining an aural proxy includes defining a polygon that encloses the listener position and portions of the scene.

8. The method of claim 7 wherein the polygon comprises a cube.

9. The method of claim 6 wherein rendering a simulated sound includes rendering a simulated sound in a video game or virtual reality environment.

10. A system for simulating directional sound reverberation, the system comprising:

a directional reverberation estimator for performing ray tracing from a listener position in a scene to surfaces visible from the listener position, for determining a directional local visibility representing a distance from the listener position to a nearest surface in the scene along each ray and for determining directional reverberation at the listener position based on the directional local visibility, wherein determining the directional reverberation based on the directional local visibility includes:

determining a reference mean free path representing an average distance traveled between successive reflections along each ray;

determining a directional mean free path based on the directional local visibility and the reference mean free path; and determining the directional reverberation at the listener position based on the directional mean free path;

wherein determining the directional reverberation includes determining a reverberation time from the directional mean free path and determining the directional reverberation using the reverberation time; and a sound renderer for rendering a simulated sound indicative of the directional reverberation at the listener position.

11. The system of claim 10 wherein determining a directional mean free path includes determining a user controlled mean free path by weighting the directional local visibility relative to the reference mean free path.

12. The system of claim 10 wherein determining a reverberation time includes adjusting the reverberation time as a function of local average distance and surface absorption properties.

13. The system of claim 10 wherein determining a directional free path includes representing the directional mean free path using spherical harmonics.

14. The system of claim 10 wherein rendering a simulated sound includes rendering a simulated sound in a video game or virtual reality environment.

15. A system for simulating early sound reflections, the system comprising:

an early reflection estimator for performing ray tracing from a listener position in a scene to surfaces visible from the listener position, for using from point visibility and an image source method to determine first order reflections of each ray in the scene, for defining an aural proxy for the scene, wherein the aural proxy comprises a geometric shape that is fit to a local geometry around a listener and wherein using the image source method includes performing ray tracing from virtual image sources, which represent the first order reflections, to identify the first order reflections that reach the listener position, the early reflection estimator for using the image source method to determine second and higher order reflections from the aural proxy, for defining scattering coefficients for surfaces in the aural proxy, and for determining early sound reflections for the scene based on the reflections determined using the image source method, the aural proxy, and the scattering coefficients; and a sound renderer for rendering a simulated sound indicative of the early reflections at the listener position.

16. The system of claim 15 wherein the aural proxy comprises a polygon that encloses the listener position and portions of the scene.

17. The system of claim 16 wherein the polygon comprises a cube.

18. The system of claim 15 wherein the sound renderer and the early reflections estimator are components of a sound engine for a video game or virtual reality application.

19. A non-transitory computer readable medium having stored thereon executable instructions that when executed by the processor of a computer control the computer to perform steps comprising:

performing ray tracing from a listener position in a scene to surfaces visible from the listener position;

determining a directional local visibility representing a distance from the listener position to a nearest surface in the scene along each ray;

determining directional reverberation at the listener position based on the directional local visibility, wherein determining directional reverberation based on the directional local visibility includes:

determining a reference mean free path representing an average distance traveled between successive reflections along each ray;

determining a directional mean free path based on the directional local visibility and the reference mean free path; and determining the directional reverberation at the listener position based on the directional mean free path; and wherein determining the directional reverberation includes determining a reverberation time from the directional mean free path and determining the directional reverberation using the reverberation time; and rendering a simulated sound indicative of the directional reverberation at the listener position.

20. A non-transitory computer readable medium having stored thereon executable instructions that when executed by the processor of a computer control the computer to perform steps comprising:

performing ray tracing from a listener position in a scene to surfaces visible from the listener position;

using from point visibility and an image source method to determine first order reflections of each ray in the scene, wherein using the image source method includes performing ray tracing from virtual image sources, which represent the first order reflections, to identify which of the first order reflections reach the listener position;

defining an aural proxy for the scene, wherein the aural proxy comprises a geometric shape that is fit to a local geometry around a listener;

defining scattering coefficients for surfaces in the aural proxy;

determining early sound reflections for the scene based on the reflections determined using the image source method, the aural proxy, and the scattering coefficients; and rendering a simulated sound indicative of the early reflections at the listener position.

* * * * *